(12) United States Patent
Liao

(10) Patent No.: US 11,988,947 B2
(45) Date of Patent: May 21, 2024

(54) AUXILIARY SUPPORT AND EXTERNAL IMAGE CAPTURE DEVICE

(71) Applicant: GUANGDONG GOPOD GROUP HOLDING CO., LTD, Guangdong (CN)

(72) Inventor: Zhuowen Liao, Guangdong (CN)

(*) Notice: Subject to any disclaimer, the term of this patent is extended or adjusted under 35 U.S.C. 154(b) by 144 days.

(21) Appl. No.: 17/773,375

(22) PCT Filed: Jun. 29, 2020

(86) PCT No.: PCT/CN2020/098911
§ 371 (c)(1),
(2) Date: Apr. 29, 2022

(87) PCT Pub. No.: WO2022/000184
PCT Pub. Date: Jan. 6, 2022

(65) Prior Publication Data
US 2022/0397810 A1    Dec. 15, 2022

(51) Int. Cl.
*G03B 17/56* (2021.01)
*F16C 11/12* (2006.01)
*F16M 11/04* (2006.01)
*F16M 11/10* (2006.01)
*F16M 13/02* (2006.01)

(52) U.S. Cl.
CPC .......... *G03B 17/561* (2013.01); *F16C 11/12* (2013.01); *F16M 11/04* (2013.01); *F16M 11/10* (2013.01); *F16M 13/02* (2013.01)

(58) Field of Classification Search
CPC ....... F16M 13/00; F16M 13/02; F16M 13/022
See application file for complete search history.

(56) References Cited

U.S. PATENT DOCUMENTS

| 6,845,954 B1 * | 1/2005 | Moayer | G06F 1/1607 396/428 |
| 7,431,253 B2 * | 10/2008 | Yeh | F16M 13/00 248/231.51 |
| 2013/0048817 A1 * | 2/2013 | Wang | F16M 13/022 29/428 |

FOREIGN PATENT DOCUMENTS

| CN | 2549498 Y | 5/2003 |
| CN | 204213565 U | 3/2015 |

OTHER PUBLICATIONS

International search report of PCT Patent Application No. PCT/CN2020/098911 issued on Mar. 26, 2021.

* cited by examiner

*Primary Examiner* — Noam Reisner

(57) ABSTRACT

An auxiliary support and an external image capturing device. The auxiliary support includes a hooking member, a supporting member and a buffer member. The hooking member is configured to be hooked to a top of a first external structural member. One end of the supporting member is connected to the hooking member. The buffer member is connected to the end of the supporting member away from the hooking member and can deform plastically. The supporting member can be bent or curved such that the buffer member can abut against a second surface when the hooking member is hooked to the first external structural member. The buffer member can increase a supporting area, prevent the auxiliary support from shaking, reduce the pressure of the auxiliary support on the first external structural member, and prevent scratch or deformation of the first external structural member.

12 Claims, 4 Drawing Sheets

the supporting member is switchable between the folded state and the supporting state, and the buffer member is capable of abutting against the second surface when the hooking member is hooked to the first external structural member and the supporting member is in the supporting state.

AUXILIARY SUPPORT AND EXTERNAL IMAGE CAPTURE DEVICE

TECHNICAL FIELD

The present application belongs to the technical field of spare parts of electronic apparatuses, and particularly relates to an auxiliary support and an external image capturing device.

BACKGROUND ART

Cameras of electronic apparatuses such as desktop computers or notebook computers are generally divided into two types, namely built-in cameras built in the electronic apparatuses and separate external cameras. The external camera is generally clamped on a display. However, the clamping of a housing of the display is likely to scratch or deform the housing, resulting in poor user experience.

SUMMARY OF THE INVENTION

Technical Problem

An objective of the present invention is to provide a clamping support, so as to solve the technical problem of an existing clamping support needing cooperation of two hands to fix an electronic apparatus or needing an electronic device to complete sensing, which is very inconvenient.

Solution to the Problem

Technical Solutions

An objective of the present application is to provide an auxiliary support and an external image capturing device intended to solve the technical problem of being likely to scratch or deform a housing of a display when clamping an external camera on the display.

The present application is implemented by an auxiliary support capable of being hooked to a first external structural member, the first external structural member having a first surface and a second surface opposite the first surface, the auxiliary support comprising:
 a hooking member configured to be hooked to a top of the first external structural member;
 a supporting member with one end connected to the hooking member; and
 a buffer member connected to the end of the supporting member away from the hooking member and capable of deforming plastically,
wherein the supporting member is capable of being bent or curved, such that the buffer member is capable of abutting against the second surface when the hooking member is hooked to the first external structural member.

In one embodiment, the supporting member comprises a first supporting plate connected to the hooking member and a second supporting plate connected to the first supporting plate, and the first supporting plate and the second supporting plate are capable of being arranged at an included angle such that the supporting member is bent.

In one embodiment, the first supporting plate is rotationally connected to the second supporting plate, the supporting member has a folded state in which the first supporting plate and the second supporting plate cover each other and a supporting state in which the first supporting plate and the second supporting plate are arranged at an included angle, the supporting member is switchable between the folded state and the supporting state, and the buffer member is capable of abutting against the second surface when the hooking member is hooked to the first external structural member and the supporting member is in the supporting state.

In one embodiment, the auxiliary support further comprises a limiting member connected to the supporting member, wherein the limiting member is configured to limit a limit angle of rotation of the second supporting plate relative to the first supporting plate.

In one embodiment, the auxiliary support, further comprises a damping shaft connected to the first supporting plate, wherein the second supporting plate is rotationally connected to the damping shaft, and the damping shaft is configured to limit the rotation of the second supporting plate relative to the first supporting plate.

In one embodiment, the buffer member comprises a buffer sheet connected to the end of the supporting member away from the hooking member and capable of deforming plastically, and a gasket connected to the buffer sheet and configured to abut against the second surface.

In one embodiment, the second supporting plate comprises a mounting plate, a locking member and a cover plate, the mounting plate is provided with a mounting recess, the locking member is capable of locking the buffer sheet to the mounting plate, the cover plate is connected to the mounting plate and is capable of covering the mounting recess, and the buffer sheet is covered by the gasket.

In one embodiment, the buffer sheet is made of a metal material.

In one embodiment, the gasket is made of a rubber material.

In one embodiment, the hooking member and the first supporting member are arranged at an included angle, and when the supporting member is in the supporting state, the hooking member and the second supporting plate are both located on the same side of the first supporting plate.

In one embodiment, the auxiliary support further comprises a mounting member connected to the hooking member or the supporting member, wherein the mounting member is configured to be connected to a second external structural member.

In one embodiment, the mounting member is provided with a mounting structure configured to mount the second external structural member.

In one embodiment, the mounting member is rotationally connected to the hooking member or the supporting member.

In one embodiment, the supporting member is provided with a clearance recess, and the mounting member is rotationally connected to a recess wall of the clearance recess and is capable of being received in the clearance recess by means of rotation.

The present application further provides an external image capturing device, comprising a camera and the auxiliary support as described above.

BENEFICIAL EFFECTS OF THE INVENTION

Beneficial Effects

Compared with the prior art, the present application has the technical effects that an auxiliary support is hooked to a first external structural member by means of a hooking member, a supporting member bears load, the supporting member can then be bent or curved so that the center of gravity of the auxiliary support is deviated toward the supporting member side, a buffer member abuts against, a second surface of the first external structural member under the action of gravity of the supporting member, the buffer member can deform plastically-, and when the buffer member abuts against the second surface, the buffer member may be deformed into an angle or a shape adapted to the second surface, so as to increase a supporting area, prevent the auxiliary support from shaking, reduce the pressure of the auxiliary support on the first external structural member, and prevent scratch or deformation of the first external structural member.

BRIEF DESCRIPTION OF THE DRAWINGS

Description of the Drawings

In order to explain the technical solutions of the embodiments of the present application more clearly, the drawings used in the embodiments of the present application or the description of the prior art will be briefly introduced below. Obviously, the drawings described below are only some embodiments of the present application, and for those of ordinary skill in the art, other drawings can be obtained on the basis of these drawings without involving any inventive effort.

Figure 1:
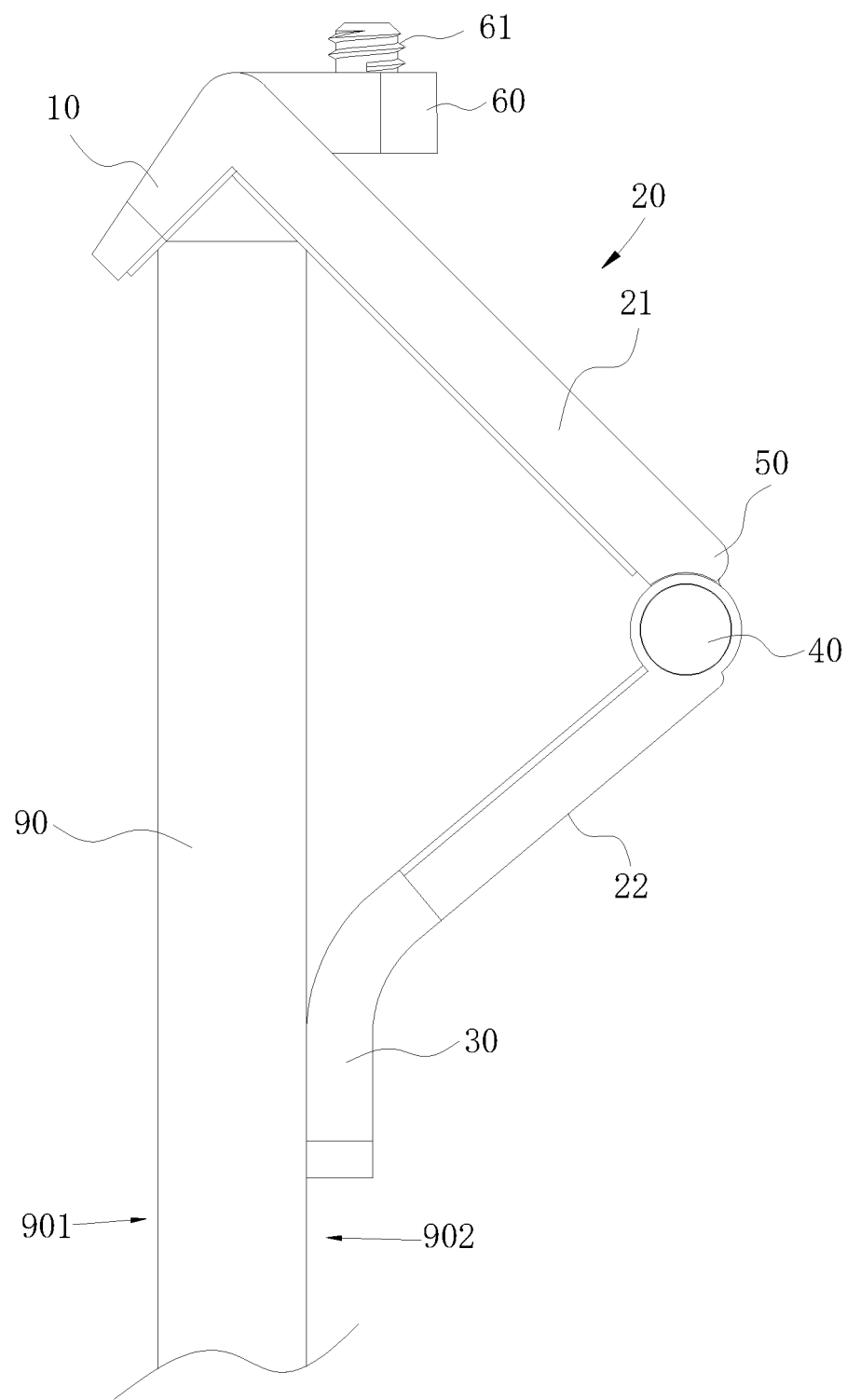
Figure 2:
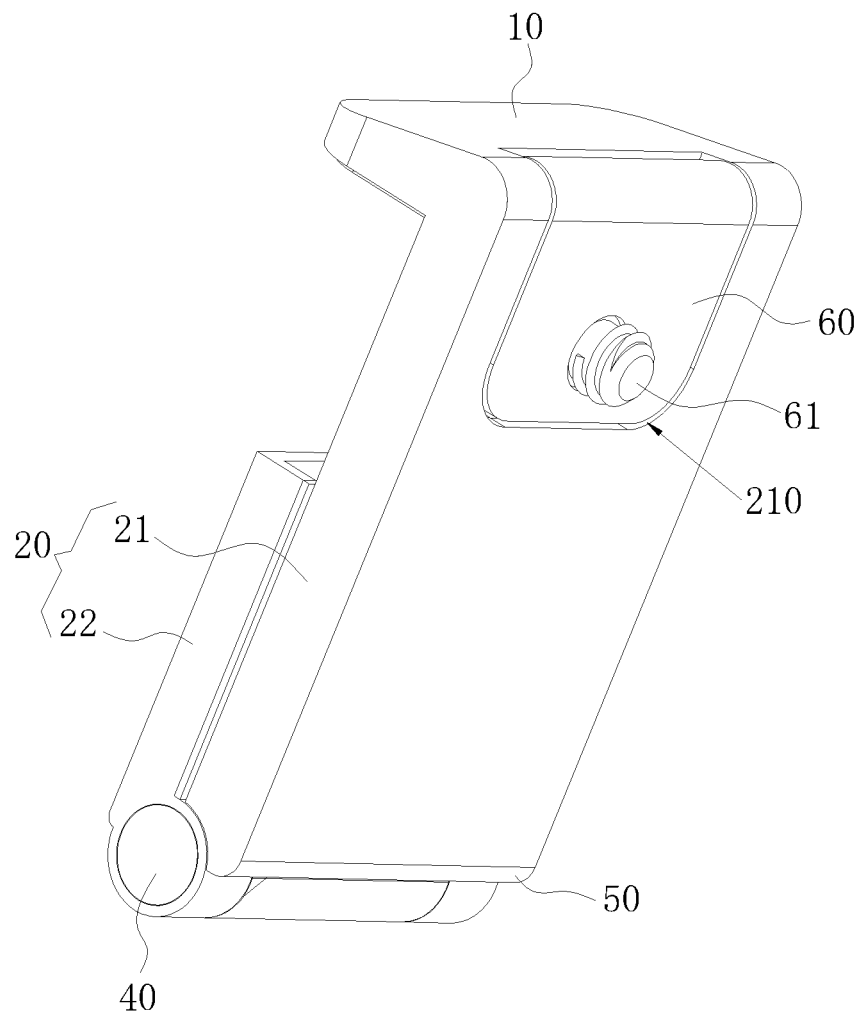
Figure 3:
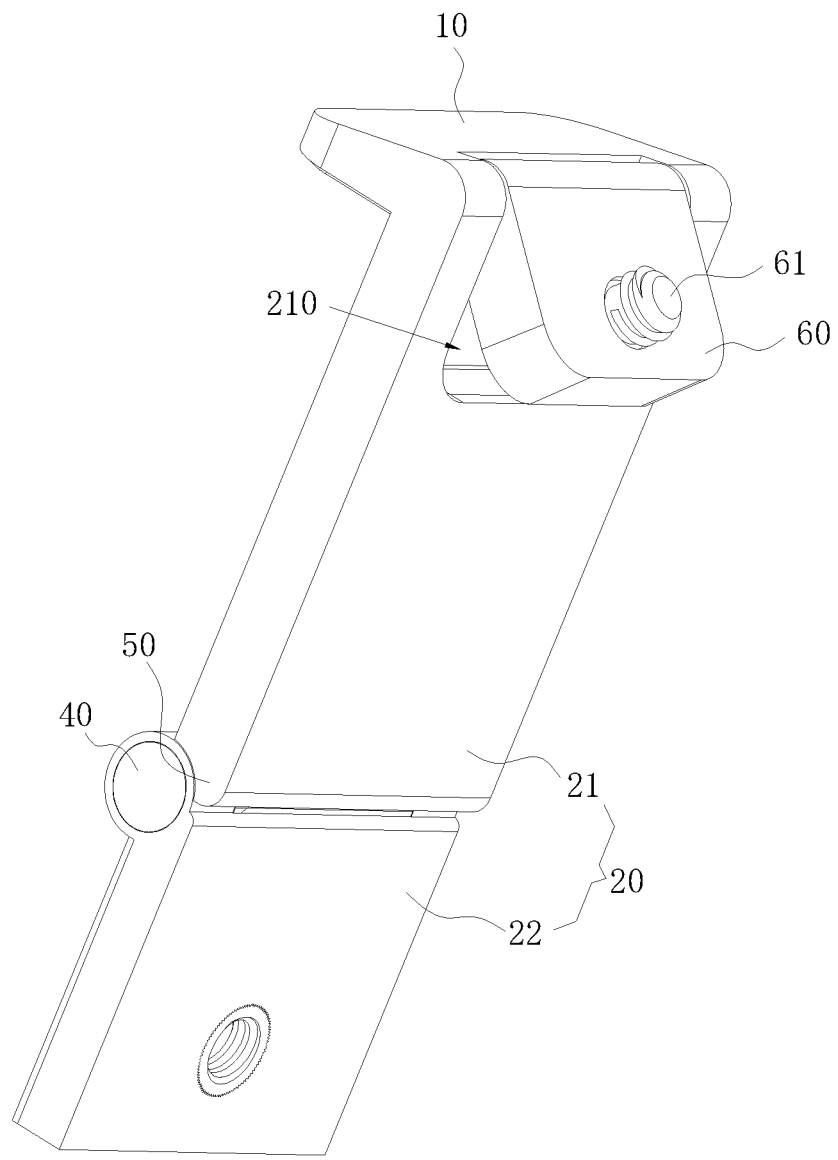
Figure 4:
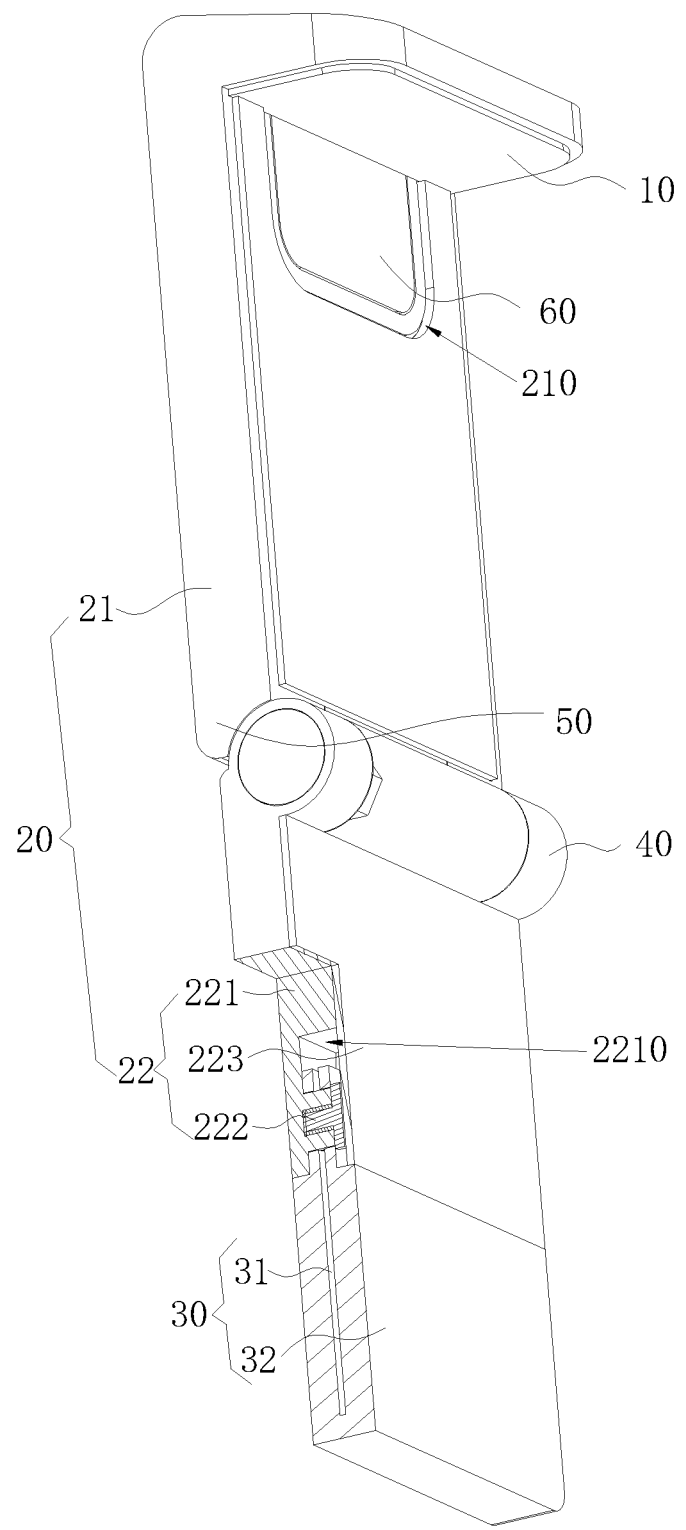

FIG. 1 is a schematic structural view of an auxiliary support provided in the embodiment of the present application in a use state, in which a supporting member is in a supporting state;

FIG. 2 is a perspective structural view of the auxiliary support provided in the embodiment of the present application, in which the supporting member is in a folded state and no buffer member is mounted;

FIG. 3 is a perspective structural view of the auxiliary support provided in the embodiment of the present application, in which the supporting member is in a limit state and no buffer member is mounted; and FIG. 4 is a partial sectional view of the auxiliary support provided in the embodiment of the present application, in which the supporting member is in the limit state and no buffer member is mounted;

LIST OF REFERENCE NUMERALS

10. Hooking member; 20. Supporting member; 21. First supporting plate; 210. Clearance recess; 22. Second supporting plate; 221. Mounting plate; 2210. Mounting recess; 222. Locking member; 223. Cover plate; 30. Buffer member; 31. Buffer sheet; 32. Gasket; 40. Damping shaft; 50. Limiting member; 60. Mounting member; 61. Mounting structure; 90. First external structural member; 901. First surface; and 902. Second surface.

EMBODIMENTS OF THE INVENTION

Implementations of the Invention

Embodiments of the present application will be described below in detail, and examples of the embodiments are shown in the drawings, wherein the same or similar reference numerals represent the same or similar elements or elements having the same or similar functions throughout. The embodiments described below with reference to the accompanying drawings are exemplary and are intended to be illustrative of the present application, and will not be interpreted as limiting the present application.

In the description of the present application, it should be understood that the orientations or positional relationships indicated by the terms "up", "down", "vertical", "horizontal", "top", "inside", "outside", etc. are based on the orientations or positional relationships shown in the drawings, and are only for the convenience of describing the present application and simplifying the description, rather than indicating or implying that an apparatus or element referred to must have a specific orientation or be constructed and operated in a specific orientation, and therefore cannot be construed as limiting the present application.

In addition, the terms "first" and "second" are used for descriptive purposes only, and cannot be construed as indicating or implying relative importance or implicitly indicating the number of technical features indicated. Thus, the features defined with "first" and "second" can explicitly or implicitly include one or more of the features. In the description of the present application, the meaning of "a plurality of" is two or more, unless otherwise explicitly and specifically defined.

In the present application, unless otherwise explicitly specified and limited, the terms such as "mount", "connected", "connect" and "fix" should be broadly understood, for example, they can be a fixed connection or a detachable connection or be integrated; can be a mechanical connection or an electrical connection; and can be directly connected with each other, or can be indirectly connected with each other through an intermediate medium, and can be communication between interiors of two elements or interaction between two elements. For those of ordinary skill in the art, the specific meanings of the above terms in the present application can be understood according to specific situations.

In order to make the object, technical solutions, and advantages of the present application clearer, the present application is described in further detail below with reference to the drawings and embodiments.

With reference to FIG. 1, an embodiment of the present application provides an auxiliary support capable of being hooked to a first external structural member 90. The first external structural member 90 has a first surface 901 and a second surface 902 opposite the first surface 901. The first external structural member 90 may be a display of a desktop computer, a display panel of a notebook computer, a tablet computer, or other structures allowing the auxiliary support to be hooked. As an example, given that the first external structural member 90 is a display panel of a notebook computer, the first surface 901 is surface B of the notebook computer, and the second surface 902 is surface A of the notebook computer.

With reference to FIG. 1, the auxiliary support includes a hooking member 10, a supporting member 20, and a buffer member 30.

With reference to FIG. 1, the hooking member 10 is configured to be hooked to the top of the first external structural member 90. That is, the hooking member 10 at least abuts against the first surface 901. In this embodiment, the hooking member 10 abuts against a top corner of the first surface 901.

With reference to FIG. 1, the supporting member 20 has one end connected to the hooking member 10 and the other end connected to the buffer member 30. The supporting member 20 can be bent or curved, such that the buffer member 30 can abut against the second surface 902 when the hooking member 10 is hooked to the first external structural member 90. That is, the supporting member 20 can be C-shaped or V-shaped and can be curved or bent toward the second surface 902 when the hooking member 10 is hooked to the top of the first external structural member 90, so as to apply to the hooking member 10 a downward force and a force in a direction from the first surface 901 toward the second surface 902, such that the hooking member 10 can firmly abut against the top of the first external structural member 90. The supporting member 20 may have a bent or curved shape with a stable structure, or may form a bent or curved shape by means of deformation.

With reference to FIG. 1, the buffer member 30 can deform plastically. A user may first plastically deform the buffer member 30 to match an abutment of the second surface 902, or may press the supporting member 20 against the interior of the buffer member to automatically plastically deform the buffer member when abutting against the second surface 902. In use, the buffer member 30 can buffer the movement of the supporting member 20 toward the second surface 902. The buffer member 30 includes a buffer sheet 31 connected to the end of the supporting member 20 away from the hooking member 10 and capable of deforming plastically, and a gasket 32 connected to the buffer sheet 31 and configured to abut against the second surface 902. The gasket 32 further buffers the abutment of the buffer sheet 31 and can also protect the buffer sheet 31. The buffer sheet 31 may be a buffer sheet 31 made of a metal material, for example, an aluminum sheet or an iron sheet. The metal material has a high structural stability and prolonged service life. The gasket 32 is a gasket 32 made of a rubber material, which has a certain elasticity and a better buffering effect. Preferably, a surface of the buffer sheet 31 is covered by the gasket 32 so as to prevent the metal buffer sheet 31 from corning into contact with air and thus being corroded or oxidized. The buffer member 30 may be detachably connected to the supporting member 20 for convenient replacement.

The auxiliary support is hooked to the first external structural member 90 by means of the hooking member 10, the supporting member 20 bears load, and the supporting member 20 can then be bent or curved so that the center of gravity of the auxiliary support is deviated toward the supporting member 20 side. The buffer member 30 abuts against the second surface 902 of the first external structural member 90 under the action of gravity of the supporting member 20. The buffer member 30 can deform plastically, and when the buffer member 30 abuts against the second surface 902, the buffer member 30 may be deformed into an angle or a shape adapted to the second surface 902, so as to increase a supporting area, prevent the auxiliary support from shaking and swinging when abutting against the surface A of the notebook computer, reduce the pressure of the auxiliary support on the first external structural member 90, and prevent scratch or deformation of the first external structural member 90.

With reference to FIG. 1, in this embodiment, the supporting member 20 has a bent shape. Specifically, the supporting member 20 includes a first supporting plate 21 connected to the hooking member 10 and a second supporting plate 22 connected to the first supporting plate 21, and the first supporting plate 21 and the second supporting plate 22 can be arranged at an included angle. The first supporting plate 21 and the hooking member 10 can together abut against the top of the first external structural member 90, in particular against the top corner of the second surface 902. The hooking member 10 and the first supporting plate 21 may be arranged at an included angle, such that the hooking member 10 and the first supporting plate 21 jointly form a hook shape. The included angle is set to be smaller than 180°. The hooking member 10 and the second supporting plate 22 may both extend toward the same side of the first supporting plate 21.

With reference to FIGS. 2 and 3, preferably, the first supporting plate 21 is rotationally connected to the second supporting plate 22, the supporting member 20 has a folded state in which the first supporting plate 21 and the second supporting plate 22 cover each other and a supporting state in which the first supporting plate 21 and the second supporting plate 22 are arranged at an included angle. The supporting member 20 can be switched between the folded state and the supporting state, and the buffer member 30 can abut against the second surface 902 when the hooking member 10 is hooked to the first external structural member 90 and the supporting member 20 is in the supporting state. It can be understood that when the supporting member 20 is in the supporting state, the first supporting plate 21 and the second supporting plate 22 are arranged at an included angle; and the first supporting plate 21 and the second supporting plate 22 covering each other means that the second supporting plate 22 is rotated to be attached to the first supporting plate 21 for facilitating storage of the supporting member 20, or the included angle between the first supporting plate 21 and the second supporting plate 22 is smaller than the included angle of the supporting member 20 in the supporting state. The supporting member 20 also has a limit state, and the supporting member 20 can be switched between the folded state, the supporting state and the limit state. When the supporting member 20 is in the limit state, the included angle between the first supporting plate 21 and the second supporting plate 22 is approximately 180°. The included angle of the supporting member 20 in the supporting state may be adjusted according to the requirements of the first external structural member 90.

With reference to FIG. 4, in this embodiment, the second supporting plate 22 includes a mounting plate 221, a locking member 222 and a cover plate 223. The mounting plate is provided with a mounting recess 2210, the locking member 222 can lock the buffer sheet 31 to the mounting plate 221, the cover plate 223 is connected to the mounting plate 221 and can cover the mounting recess 2210, and the buffer sheet 31 is covered by the gasket 32. The locking member 222 may be a screw, the buffer sheet 31 is provided with a mounting hole, the mounting recess 2210 penetrates to the side of the second supporting plate 22 facing away from the first supporting plate 21, and the locking member 222 passes through the mounting hole and can lock the buffer sheet 31 to a bottom of the mounting recess 2210, so as to fixedly connect the buffer sheet 31 to the second supporting plate 22. The cover plate 223 covers the mounting recess 2210, such that the second supporting plate 22 is more attractive.

With reference to FIGS. 2 and 3, the auxiliary support further includes a damping shaft 40 connected to the first supporting plate 21. The second supporting plate 22 is rotationally connected to the damping shaft 40, and the damping shaft 40 is configured to limit the rotation of the second supporting plate 22 relative to the first supporting plate 21, such that, the first supporting plate 21 and the second supporting plate 22 can maintain the current angle without external force.

With reference to FIGS. 2 and 3, to limit a limit angle of rotation of the first supporting plate 21 relative to the second supporting plate 22, the auxiliary support further includes a limiting member 50 connected to the supporting member 20. In this embodiment, the limiting member 50 is located in a path of rotation of the second supporting plate 22, and the supporting member 20 is in the limit state when the second supporting plate 22 is rotated to the limit angle. The limiting member 50 and the first supporting plate 21 may be integrally formed.

With reference to FIG. 3, the auxiliary support further includes a mounting member 60 connected to the hooking member 10 or the supporting member 20. The mounting member 60 is configured to be connected to a second external structural member. The second external structural member may be a supportable electronic apparatus, such as a camera, a light supplement lamp and a microphone, or may be a structural member that needs to be fitted to the first external structural member 90.

With reference to FIGS. 2 and 3, to facilitate mounting of the second external structural member, the mounting member 60 is provided with a mounting structure 61. The mounting structure 61 is configured to mount the second external structural member. The mounting structure 61 may be of a columnar structure such as a screw, or a hole-like structure such as a screw hole.

Preferably, the mounting member 60 is rotationally connected to the hooking member 10 or the supporting member 20 in order to adjust an orientation of the second external structural member. In this embodiment, the mounting member 60 is rotationally connected to the connection between the hooking member 10 and the supporting member 20, such that when the hooking member 10 is hooked to the top of the first external structural member 90, the second external structural member is located at the uppermost of the auxiliary support and is prevented from being shielded.

With reference to FIG. 3, to facilitate storage of the mounting member 60, the supporting member 20 is provided with a clearance recess 210. Specifically, the first supporting plate 21 is provided with the clearance recess 210, and the mounting member 60 is rotationally connected to a recess wall of the clearance recess 210 and can be received in the clearance recess 210 by means of rotation. In this way, the mounting plate 221 can be received in the clearance recess 210 when not in use and can be rotated out of the clearance recess 210 when in use. Preferably, the mounting member 60 is flush with the first supporting plate 21 when received in the clearance recess 210.

An embodiment of the present application further provides an external image capturing device, including the auxiliary support provided in the above embodiments. The auxiliary support has the same structural features and functions as the auxiliary support in each of the above embodiments, which will not be repeated herein.

The external image capturing device further includes a camera which is the second external structural member in the above embodiments. The camera is mounted to the mounting member 60, and the camera is rotatably connected to the mounting structure 61, such that the user can adjust a vertical orientation of the camera by rotating the mounting member 60, and adjust a horizontal orientation of the camera by rotating the camera relative to the mounting structure 61.

The above embodiments are merely preferred embodiments of the present application, only the technical principles of the present application are specifically described, and these descriptions are only for explaining the principles of the present application and cannot be interpreted in any way as limiting the scope of protection of the present application. On the basis of the explanation herein, any modifications, equivalent replacements, and improvements made within the spirit and principles of the present application, and other specific implementations of the present application conceived by those skilled in the art without involving any inventive effort should be included within the scope of protection of the present application.

The invention claimed is:

1. An auxiliary support capable of being hooked to a first external structural member, the first external structural member having a first surface and a second surface opposite the first surface, the auxiliary support comprising:
   a hooking member configured to be hooked to a top of the first external structural member;
   a supporting member with one end connected to the hooking member; and
   a buffer member connected to the end of the supporting member away from the hooking member and capable of deforming plastically,
   wherein the supporting member is capable of being bent or curved, such that the buffer member is capable of abutting against the second surface when the hooking member is hooked to the first external structural member;
   wherein the supporting member comprises a first supporting plate connected to the hooking member and a second supporting plate connected to the first supporting plate, and the first supporting plate and the second supporting plate are capable of being arranged at an included angle such that the supporting member is bent;
   wherein the buffer member comprises a buffer sheet connected to the end of the supporting member away from the hooking member and capable of deforming plastically, and a gasket connected to the buffer sheet and configured to abut against the second surface;
   wherein the second supporting plate comprises a mounting plate, a locking member and a cover plate, the mounting plate is provided with a mounting recess, the locking member is capable of locking the buffer sheet to the mounting plate, the cover plate is connected to the mounting plate and is capable of covering the mounting recess, and the buffer sheet is covered by the gasket.

2. The auxiliary support according to claim 1, wherein the first supporting plate is rotationally connected to the second supporting plate, the supporting member has a folded state in which the first supporting plate and the second supporting plate cover each other and a supporting state in which the first supporting plate and the second supporting plate are arranged at an included angle, the supporting member is switchable between the folded state and the supporting state, and the buffer member is capable of abutting against the second surface when the hooking member is hooked to the first external structural member and the supporting member is in the supporting state.

3. The auxiliary support according to claim 2, further comprising a limiting member connected to the supporting member, wherein the limiting member is configured to limit a limit angle of rotation of the second supporting plate relative to the first supporting plate.

4. The auxiliary support according to claim 2, further comprising a damping shaft connected to the first supporting plate, wherein the second supporting plate is rotationally connected to the damping shaft, and the damping shaft is configured to limit the rotation of the second supporting plate relative to the first supporting plate.

5. The auxiliary support according to claim 2, wherein the hooking member and the first supporting member are arranged at an included angle, and when the supporting member is in the supporting state, the hooking member and the second supporting plate are both located on the same side of the first supporting plate.

6. The auxiliary support according to claim 1, wherein the buffer sheet is made of a metal material.

7. The auxiliary support according to claim 1, wherein the gasket is made of a rubber material.

8. The auxiliary support according to claim 1, further comprising a mounting member connected to the hooking member or the supporting member, wherein the mounting member is configured to be connected to a second external structural member.

9. The auxiliary support according to claim 8, wherein the mounting member is provided with a mounting structure configured to mount the second external structural member.

10. The auxiliary support according to claim 9, wherein the mounting member is rotationally connected to the hooking member or the supporting member.

11. The auxiliary support according to claim 10, wherein the supporting member is provided with a clearance recess, and the mounting member is rotationally connected to a recess wall of the clearance recess and is capable of being received in the clearance recess by means of rotation.

12. An external image capturing device, comprising a camera and the auxiliary support of claim 1.

\* \* \* \* \*